United States Patent
Kemper et al.

(10) Patent No.: US 7,064,809 B2
(45) Date of Patent: Jun. 20, 2006

(54) APPARATUS AND METHOD FOR PROCESSING WAFERS

(75) Inventors: Franz Kemper, Pöcking (DE); Jens Möckel, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/045,481

(22) Filed: Jan. 31, 2005

(65) Prior Publication Data

US 2005/0168715 A1   Aug. 4, 2005

Related U.S. Application Data

(63) Continuation of application No. PCT/DE03/02554, filed on Jul. 30, 2003.

(30) Foreign Application Priority Data

Jul. 31, 2002   (DE) ................. 102 34 943

(51) Int. Cl.
  *G03B 27/32*   (2006.01)
  *G03B 27/58*   (2006.01)
(52) U.S. Cl. .......................... 355/72; 355/77
(58) Field of Classification Search ............. 355/72, 355/75, 77
See application file for complete search history.

(56) References Cited

U.S. PATENT DOCUMENTS

| | | | |
|---|---|---|---|
| 4,792,658 A | 12/1988 | Langhans et al. | |
| 5,029,243 A | 7/1991 | Dammann et al. | |
| 5,479,108 A | 12/1995 | Cheng | |
| 5,558,110 A * | 9/1996 | Williford, Jr. | 134/56 R |
| 5,623,473 A * | 4/1997 | Ichihara | 430/321 |
| 5,982,166 A | 11/1999 | Mautz | |
| 6,009,888 A * | 1/2000 | Ye et al. | 134/1.3 |
| 6,307,617 B1 * | 10/2001 | Nishiki et al. | 355/53 |
| 6,442,312 B1 * | 8/2002 | Terao et al. | 385/37 |
| 6,496,245 B1 * | 12/2002 | Kosugi et al. | 355/27 |
| 6,541,747 B1 * | 4/2003 | Kikuchi et al. | 250/201.2 |
| 6,592,435 B1 * | 7/2003 | Kishima | 451/59 |
| 2004/0060910 A1 * | 4/2004 | Schramm | 219/121.69 |

FOREIGN PATENT DOCUMENTS

DE     44 20 347 A1   12/1995

OTHER PUBLICATIONS

Data Sheet, "Wafer Repair M430", GSI Lumonics, Jan. 2003, 2 pages.
Data Sheet, "Modell 9800", Electro Scientific Industries, Inc. USA, Feb. 2001, 2 pages.

* cited by examiner

*Primary Examiner*—Rodney Fuller
(74) *Attorney, Agent, or Firm*—Edell, Shapiro & Finnan, LLC

(57) ABSTRACT

An apparatus for processing semiconductor wafers includes: a wafer support with a first positioning system that can rotate the wafer support coaxially with a wafer; at least one processing apparatus, which can be moved with a second positioning system such that a processing tool proceeding from the processing apparatus can be guided radially over the wafer; and at least one position determining apparatus for determining a wafer position on the basis of features of the wafer. Alignment marks of the wafer are found and points to be processed, such as laser fuses, are moved by rotation of the wafer and movement of at least one processing apparatus in the radial direction above the wafer.

15 Claims, 2 Drawing Sheets

APPARATUS AND METHOD FOR PROCESSING WAFERS

CROSS REFERENCE TO RELATED APPLICATIONS

This application is a continuation of PCT/DE2003/02554, filed Jul. 30, 2003, and titled "Processing Device for Wafers and Method for Processing Thereof," which claims priority to German Application No. DE 1023493.6, filed on Jul. 31, 2002, and titled "Processing Device for Wafers and Method for Processing Thereof," the entire contents of which are hereby incorporated by reference.

FIELD OF THE INVENTION

At the present time so-called "laser fuses" are used on many semiconductor chips. They are wirelike semiconductor structures on the chips which can be destroyed and then electrically opened by means of a laser beam. The fuses, which are referred to as "links", are used to repair memory chips, to program specific functions, to set operating voltages and frequencies and to provide chips with specific identification features. In the case of expensive semiconductor chips, reserve areas comprising structures are provided. Occasionally, redundant structures are provided, so that, in the event of structures failing, a redundant structure can be activated by opening of corresponding laser fuses. Presently, almost all semiconductor manufacturers use special installations provided with diode-pumped lasers for the process of opening the laser fuses. Employing a special optical system and a complex beam positioning system, the focused laser beam is positioned over the laser fuses to be opened and the latter are then opened by a laser pulse having a length of just a few nanoseconds (ns). After a recharge phase of the order of microseconds (μs), the laser can then open the next fuse.

BACKGROUND

The prior art described two systems that are used for opening laser fuses. In one system, the laser energy is applied, to the fuse to be opened, by a linear-motor-driven positioning system. In this case, the wafer bears on a chuck that can be moved in one dimension by a linear motor. A laser scanning apparatus can be moved over the wafer in a second dimension, orthogonal to the first dimension, by means of a linear-motor-driven optical system. The combination of both linear motors covers the entire area of the wafer. In the other system, the laser beam is positioned on the wafer by a biaxial galvanometer system. In addition, the wafer moves in large steps under the galvanoelements of the system, since these can cover only a small rectangular region on the wafer.

The fundamental procedure when opening the laser fuses is the same in both systems and comprises a multistage process that is described below.

First, a so-called wafer alignment is carried out, in the course of which the positioning of the wafer is ascertained with the aid of an optically scanned markings on the wafer, for example. The wafer is brought into correspondence according to the control program controlling the system.

Next, the actual beam positioning system is moved to the first processing chip or process field on the wafer, where chip or field focusing is effected in order that the laser can apply its maximum energy on the surface of the chip or the field. Since the wafer alignment permitted only a coarse positioning of the wafer, a chip or field alignment is now carried out by the so-called alignment marks on the chips or fields. This is done by carrying out a multiple linear movement of the positioning systems in order to enable the alignment marks to be scanned. In other words, to guide the alignment marks through under the optical recognition systems so that the latter can utilize the occurrence of an alignment mark or the recognition of a pattern of alignment marks to perform a very exact determination of the wafer orientation.

After this fine orientation, it is now possible to process the laser fuses on the chip or the field by driving one of the linear motors or one of the galvanoelements, respectively. After reaching the expected fuse location of the next fuse to be processed, the laser is activated and severs the fuse. This is carried out successively for all fuses of a chip or field, so that crossing and repeating routes of the system can occur. After the processing of one chip or field has been concluded, the positioning system is moved such that the next chip or field comes into the coarse processing region and a new focusing and new chip or field alignment has to be carried out. This sequence is continued until all chips or fields on a wafer have been correspondingly processed.

The chips on a wafer are accommodated such that they are closely adjoined to one another two-dimensionally and in rectangular fashion. The alignment marks are generally positioned at locations where they are meaningful for the positioning of the chips or fields, and they do not disturb the actual circuit structures either. By contrast, the laser fuses are positioned where this results from the circuit layer construction. This results in, given identical chips on a wafer, the alignment marks running in mutually parallel rows and columns if a two-dimensional grid is imagined on the wafer. The fuses also lie in such a grid in lines and columns. However, these lines and columns for the alignment marks are generally not the same as the laser fuses. Therefore, after the alignment marks have been scanned, a chip or field has to be processed without the alignment mark recognition apparatus passing an alignment mark again. It is typically necessary, prior to the processing of the next chip or field, to specially search anew for the latter's alignment marks since a reorientation of the system may become necessary from chip to chip, in order to ensure the required accuracy.

Depending on the product, between a few hundred and a million laser fuses have to be opened per wafer. These laser fuses are arranged in a manner distributed over the wafer. Moreover, other laser fuses have to be opened on each wafer in order to comply with the respective individual conditions or defects of the individual wafers. The beam positioning process is thus unique for each wafer and, as a result, in addition to finding the alignment marks complex and very time-consuming, none of the commercially available systems permits parallel processing of a plurality of chips since the majority of positioning systems required for this would otherwise interfere with one another.

Consequently, the process described above is time-consuming and separates between focusing, alignment and processing process. Both focusing and alignment processes are carried out by linear movements.

SUMMARY OF THE INVENTION

The present invention provides a system which minimizes many of the positioning and movement steps required to allow a faster, more cost-effective, and more reliable processing of laser fuses on wafers.

The invention is based on the idea of no longer moving the wafer on its chuck linearly, but rather rotating it.

This has numerous advantages, as described further below, and simplifies the construction of the apparatus.

Accordingly, the invention is directed to an apparatus for processing semiconductor wafers, including: a wafer support with a first positioning system, which can rotate the wafer support coaxially with the wafer; at least one processing apparatus, which can be moved with a second positioning system such that a processing tool proceeding from the processing apparatus can be guided radially over the wafer; at least one position determining apparatus, for determining a wafer position on the basis of features of the wafer; and in which the position determining apparatus is designed such that, to determine the wafer position, during a rotary movement of the wafer, it continuously detects features distributed on the wafer and calculates a wafer position therefrom.

The use of a rotating and of a linearly movable positioning system which works in the radial direction with respect to the wafer makes it possible to move over the entire area of the wafer in a very simple manner. Each radius of the wafer can be rotated under the processing apparatus and each point on each radius can be moved by the radial movement of the processing tool. The wafer support (e.g., chuck) is designed such that during a positioning of the wafer, the axis of rotation thereof is located as precisely as possible above the axis of rotation of the wafer support in order to enable a precise rotation of the wafer. A processing apparatus according to an embodiment of the present invention is a mechanism which serves for operation of the actual processing tool. The processing tool according to an embodiment of the present invention is anything that can be used to act on the wafer for processing purposes.

The first positioning apparatus may be a controllable rotary device, such as an electric motor that runs as exactly as possible, for example a stepper motor. A drive of the wafer support by means of a drive belt, comparable to that of disk players, or a hydraulic drive, for example a gyroscopic drive, are also conceivable.

The second positioning apparatus for the processing apparatus may correspond to the positioning apparatuses with linear motors and/or galvanoelements.

For the exact positioning of the processing tool on the wafer, in addition at least one position determining apparatus is also employed, which can evaluate features such as, for instance, alignment marks on the wafer to correlate them with the positioning of chips or fields or individual elements on the chips and fields on the wafer. A principle application for the apparatus according to the invention is the fusing of laser fuses. However, the present invention is not restricted to laser fuses, as indicated by the above definition of the apparatus. Rather, it can be used to perform a wide variety of manipulations in a simple manner at the wafer, for example to introduce holes, to solder on elements or to cover specific regions of chips with resists in order to protect them against accesses by unauthorized entities.

The apparatus will generally furthermore include a control apparatus for evaluating the wafer position or wafer positions determined by the position determining apparatus, for controlling the first and second positioning systems in a manner dependent on the wafer position and for activating and deactivating the processing tool. Such a control apparatus may be regarded as an integral component part of the apparatus according to the invention, but may also be connected as an external unit, for example in the form of a workstation or a personal computer, to the corresponding electrical inputs and outputs of an apparatus according to the invention. On account of the complexity of driving the individual points to be processed, the control apparatus will quite generally be a powerful data processing system with a corresponding control program. Although, it is also conceivable to use a hardwired apparatus if many wafers with identical chips are intended to be processed. In particular, the control systems serve to correlate the features found with the expected positions of the points to be processed on the chips or fields. Since a rotational movement is added, trigonometrical functions are additionally required in this case for the location determining processes, but such functions are likewise familiar to the person skilled in the art. The position determining apparatus may be embodied as an autonomous unit which is able to autonomously calculate positions of the features found in relation to the respective wafer rotation. However, in many cases it will be preferred for the position determining apparatus to have a calculation apparatus designed as part of the control apparatus and thus integrated into the latter. As a result, only the sensors are required and the actual position determination can take place in the control apparatus.

The position determining apparatus can have a measuring device for an optical parameter in terms of which the feature differs from the rest of the wafer. This enables optical scanning and pattern recognition on the wafer. The optical parameter can be, by way of example, the color of the feature, the form of the feature, its brightness, its absorption behavior, its reflection behavior, or its polarization capability. Customary alignment marks on wafers at the present time are composed of aluminum, which can be clearly differentiated from the rest of the wafer surface on account of its reflection and its brightness.

As already mentioned, the processing apparatus can be of a very varied nature. Since a main area of use for the invention presented resides in the opening of laser fuses, it is preferred, in particular, for the processing apparatus to be a laser apparatus, the processing tool then being the laser beam of the laser apparatus.

On the other hand, the processing apparatus can also be a different tool, such as, a drilling apparatus, and the processing tool may then be a drill bit. In a preferred embodiment, which is possible only by virtue of the special arrangement of the elements in accordance with the invention, a plurality of processing apparatuses can be guided over the wafer simultaneously.

The apparatus according to the invention can have, by way of example, three processing apparatuses arranged such that the processing tools can be guided radially over the wafer at an angle of 120° with respect to one another. It is also possible for the apparatus, according to the invention, to have two processing apparatuses arranged such that the processing tools can be guided on a common line radially over the wafer. This embodiment has the effect that the tools slide along one another or are moved toward one another in a parallel fashion. As an alternate embodiment, the two processing apparatuses may also be arranged such that the processing tools can be guided radially over the wafer orthogonally with respect to one another. The processing apparatuses can be moved such that the processing tool proceeding from the processing apparatus can be guided from an edge of the wafer as far as its center. This already suffices to cover the entire area of the wafer, since all the radials of the wafer can be guided through under the processing tool, so that all points of the wafer are accessible to processing. As an alternative, it is possible, of course, to design the processing apparatus such that the processing tool can be guided over the entire diameter rather than just over a radius. This may be advantageous, for example, when using a plurality of processing apparatuses which do not interfere with one another (for example laterally arranged lasers whose beams are controlled galvanically by means of mirrors) but are intended to remain in operation simultaneously. Moreover, depending on the embodiment of the processing apparatus, moving from one side of the wafer via a central axis to the other side of the wafer (that is to say to the other radius) can be effected more rapidly than a rotation of the wafer by the wafer support in order to bring the point to be processed to the "correct" side and thus under the processing tool. Finally, it is possible to arrange a plurality of processing apparatuses such that each apparatus covers only a part of the radius, that is to say, a plurality of processing apparatuses are employed in order to cover the entire area of the wafer. Such an arrangement simplifies the construction of the apparatus according to the invention with a plurality of processing apparatuses.

The invention is furthermore directed to a method, everything described above with respect to the apparatus equally applying to the method, and vice versa.

The invention is furthermore directed to a method for processing semiconductor wafers, including the following: rotating a wafer to find at least one feature of the wafer; determining the wafer position on the basis of the at least one feature found; rotating the wafer and in the process continuously detecting further features distributed on the wafer, and continuously evaluating the features detected during the rotary movement of the wafer; calculating the wafer position therefrom; moving at least one processing apparatus in the radial direction above the wafer in order to position a processing tool of the processing apparatus above a predetermined point on the wafer; and processing the wafer by the processing tool at the predetermined point.

The sequence of the method steps which is portrayed chronologically here with respect to a predetermined point differs significantly from the prior art through the use of a rotary movement. Firstly, the current wafer position is determined by rotating the wafer to find features, for example alignment marks, on the wafer (using a corresponding position determining tool), on the basis of which the exact position of the wafer can then be calculated with regard to its rotation. With knowledge of the positions of the points that are to be moved to, it is then possible to calculate how the wafer has to be rotated to bring it under the processing apparatus and how the processing apparatus has to be moved with the positioning apparatus in order to position the processing tool above the point to be processed. The more features, such as alignment marks, that can be found for the determination of the current wafer position; the more accurately the actual wafer position is calculated. This involves an iterative method in which the current position of the wafer can be specified more precisely with each alignment mark found despite the wafer being rotated.

Since the rotation of the wafer for the positioning of a predetermined point under the processing tool is at the same time used for continuously detecting and evaluating further features distributed on the wafer, it is thus possible to achieve a further improvement of the method according to the invention. In this case the position determining apparatus used for this remains active and continuously attempts, during the rotation of the wafer, to identify features and include them in the position calculation. The position determining apparatus may, for example, also be arranged at the processing apparatus and thus moves additionally over the wafer and can thus find features on the wafer that are situated at a differing distance from its axis. Alternatively, a system which operates independently thereof is also conceivable, which can move independently over the wafer in the radial direction. As previously mentioned, the features may be, for example, alignment marks on the wafer. However, it is also possible to use other suitable features, such as the actual structures of the integrated circuits.

The features may be, by way of example, metalized regions on the wafer which differ from the rest of the wafer in terms of their reflectivity to light and/or in terms of their form.

For the processing of a predetermined point by the processing tool, rotary movement of the wafer and radial movement of the processing apparatus can be stopped in order to enable processing without any problems, depending on the processing length. Since the requisite time is on the order of ns when separating laser fuses, however, in specific embodiments it is preferred for the rotation of the wafer to be effected at a constant angular velocity and the processing of the wafer to be effected at the rotating wafer. It is also possible for the rotation not to be constant and nevertheless to be effected during the movement of the wafer. In general, the ns processing time suffices to separate a laser fuse even when the wafer and/or the processing tool move during the laser pulse.

Furthermore, the movement of the processing apparatus may preferably be coordinated with the rotation of the wafer such that, in order to process the wafer at all predetermined points, the processing apparatus has to be guided only once over a radius of the wafer. This means that the wafer is guided only once from the outside inward or from the inside outward in order to reach all points if the rotation is fast enough in order to enable a complete revolution of the wafer and thus the reaching of all predetermined points within a specific distance from the central axis before the processing apparatus moves the processing tool. The principle is similar to that of records or compact discs, in the case of which an item of information is read out during continuous rotation by means of a scanner (laser or pick-up needle). An apparatus according to the invention for use with the method according to the invention can have, for example, a similar construction to CD burners. In this case, it must be taken into account, if appropriate, that the items of information to be scanned are arranged spirally on the medium both in the case of records and in the case of compact discs, which is not the case with chips on a wafer, which have more of a uniform distribution over the area of all features and points to be processed.

It is possible to achieve a further increase in the processing speed if use is made of a path distance optimization program which works out how the various points to be processed on the wafer can be driven on the shortest path. In this case, it can also be advantageous for the speed of the positioning apparatuses not to be kept constant, but rather to be adapted in each case such that the points to be processed have to be driven optimally with respect to time.

The method according to the invention can also be characterized in that the processing is effected by a plurality of processing tools of a plurality of processing apparatuses.

The processing preferably comprises laser burning of the surface of the wafer at the predetermined points. This may serve for separating laser fuses, for example.

The above and still further aspects, features, and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will be explained in more detail below on the basis of exemplary embodiments, reference being made to the accompanying drawings, in which the following is illustrated.

DETAILED DESCRIPTION

Figure 1:
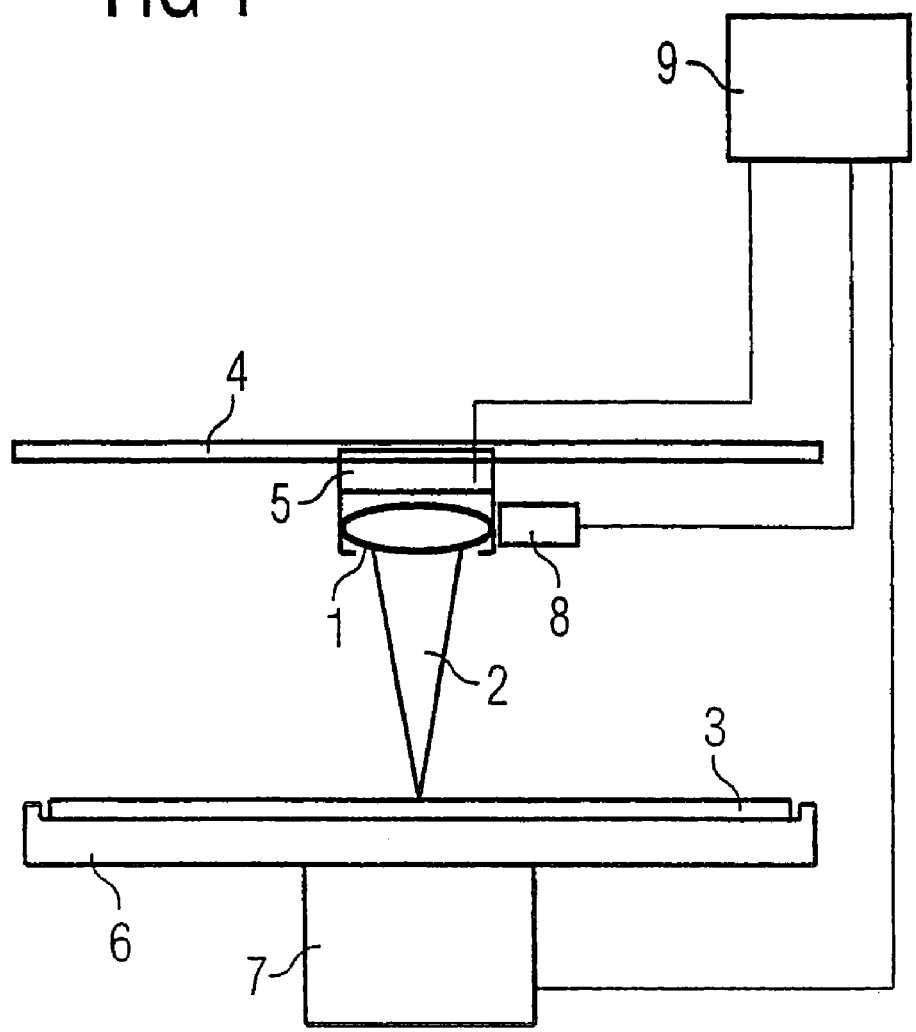
FIG. 1 illustrates a laser processing apparatus for a wafer.

FIG. 1 schematically shows a processing apparatus 1, employing a processing tool, such as a laser beam 2 focused onto a wafer 3. The processing apparatus 1 moves in the radial direction over the wafer, for example with the aid of a linear motor 5 guided at a rail 4. Alternate mechanisms are also possible, for example a galvanometric system in which the laser focus can be guided over the wafer by means of mirrors without necessitating a mechanical movement of the processing apparatus 1. A wafer support 6 and an associated positioning system 7 serve for rotation and positioning of the wafer 3. A position determining apparatus 8 is arranged at the processing apparatus 1 and is connected to a control apparatus 9 via a cable. Further cables are connected to the positioning systems 5 and 7 and serve for driving the motors for the positioning of wafer 3 and processing apparatus 1.

Figure 2:
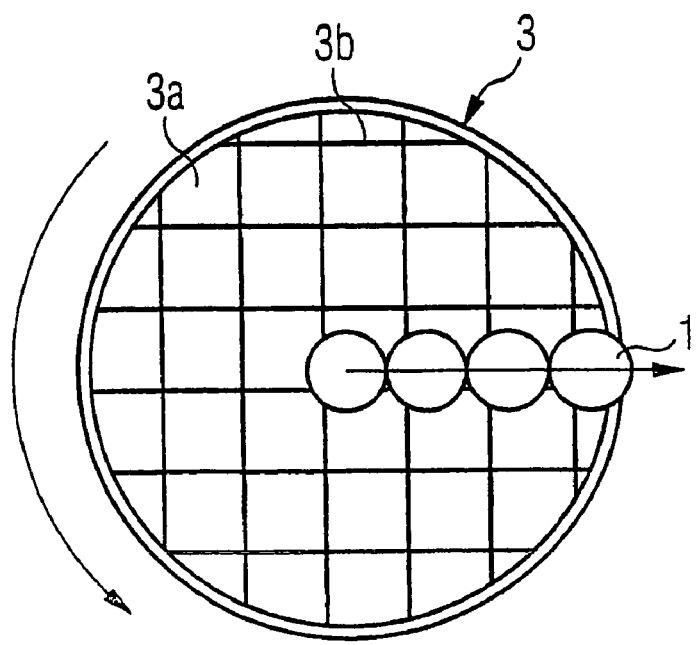
FIG. 2 illustrates a plan view of an apparatus according to an embodiment of the present invention with a radially movable processing apparatus.

FIG. 2 shows a first embodiment of the present invention in planar view. The wafer 3, with a series of individual semiconductor chips 3a, which are separated from one another by separating lines 3b and are singulated along the lines, rotates about its axis with the aid of the wafer support 6 and the positioning system 7. The processing apparatus 1 can again move in radial movement over the wafer 3, as indicated by the four different locations the processing apparatus 1 can occupy. It can be seen that all points on the wafer 3 can be driven in this way.

Figure 3:
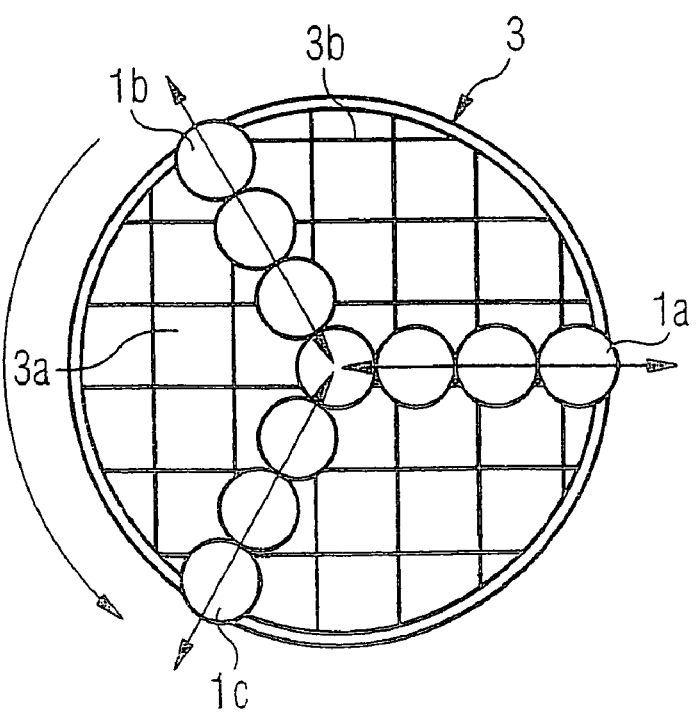
FIG. 3 is illustrative of a further embodiment of an apparatus according to the invention with three processing apparatuses.

FIG. 3 shows a further embodiment of the apparatus according to the present invention, in which a total of three laser-optical processing apparatuses 1a, 1b and 1c are provided, which are arranged at an angle of 120° with respect to one another and can be moved in each case from the edge of the wafer radially up to its central axis. In this case, a technical programming task for the control apparatus is to select the points to be processed such that the individual processing apparatuses 1a, 1b and 1c do not interfere with one another in the region of the central axis of the wafer, rather only one of the apparatuses in each case is moved into the overlapping region.

The apparatus and the method according to the invention have the following advantages over the prior art. The movements of the positioning unit for the processing apparatus are constant to the greatest possible extent since they can be effected in one axis. The wafer can rotate with a uniform speed or else with a varying speed, while the processing apparatus and the processing tool move above the wafer in one axis. Depending on the control software, it is no longer necessary to move to specific positions multiply or to cross over them. As a result, it is possible to increase the throughput of the method compared with that of the prior art.

A single focusing and subsequent initial alignment on the basis of features on the wafer is sufficient because new items of information concerning detected features, such as alignment marks, are continuously available as a result of the rotary movement of the wafer. The reason for this is that, due to the rotation, a different angle of the wafer with respect to the position determining apparatus is continuously being attained and the alignment marks lying in parallel rows or columns. This is in contrast to the procedure in the prior art, where either all of the wafer angles are affected by one of the linear movements or none is affected. Rather, alignment marks continuously rotate through under the position determining apparatus, where alignment marks originate from different chips and from different regions of the chips and fields. Although the computation complexity required for identifying the alignment marks rises as a result, this is no longer a difficulty given the available computing powers of modern control systems. The alignment marks can thus be utilized for the continuous correction of the last available focus and alignment information items. This leads to greater accuracy as a result of the rapidly available higher number of current, available alignment information items. Since these information items are obtained without further complexity, process time is also saved as a result of this.

All points of the wafer are imaged on an arbitrary radius on account of the rotational movement of the wafer. This means that the positioning of the laser optical system above the wafer can take place at an arbitrary location as long as the radius of the wafer is covered. This effect permits a plurality of processing apparatuses, for instance beam positioning systems, which do not obstruct one another to be positioned above the wafer. This can be utilized in order to further increase and multiply the throughput.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

REFERENCE SYMBOLS 1 processing apparatus
2 processing tool (laser beam)
3 wafer
4 guide rail
5 linear motor
6 wafer support
7 positioning system
8 position determining apparatus
9 control apparatus

What is claimed is:

1. An apparatus for processing semiconductor wafers, comprising:
  a wafer support with a first positioning system operable to rotate the wafer support coaxially with respect to a wafer;
  a second positioning system;
  at least one processing apparatus including a processing tool, wherein the second positioning system is operable to move the at least one processing apparatus such that the processing tool is guided radially over the wafer;

at least one position determining apparatus operable to determine a current wafer position based on features of the wafer, wherein the position determining apparatus is configured to determine the wafer position during a rotary movement of the wafer, continuously detect features distributed on the wafer, and calculate the wafer position from the features; and a control apparatus configured to evaluate the current wafer position determined by the at least one position determining apparatus, wherein the control apparatus controls the first positioning system such that a predetermined point on the wafer is brought under the processing apparatus by a rotation of the wafer, and the control apparatus calculates the required rotary movement of the wafer by the first positioning system in a manner dependent on the current wafer position and a position of the predetermined point on the wafer.

2. The apparatus as claimed in claim 1, wherein the control apparatus controls the second positioning systems in a manner dependent on the current wafer position and the position of the predetermined point on the wafer, and the control apparatus activates and deactivates the processing tool.

3. The apparatus as claimed in claim 2, wherein the position determining apparatus includes a calculation apparatus designed as part of the control apparatus.

4. The apparatus as claimed in claim 1, wherein the position determining apparatus includes a measuring apparatus configured to measure an optical parameter of the features that differ from the rest of the wafer, wherein the optical parameter includes at least one of: color, form, brightness, absorption behavior, reflection behavior, and polarization capability.

5. The apparatus as claimed in claim 1, wherein the at least one processing apparatus includes a laser apparatus, and the processing tool includes a laser beam.

6. The apparatus as claimed in claim 1, wherein the apparatus for processing semiconductor wafers includes a plurality of the processing apparatuses.

7. The apparatus as claimed in claim 1, wherein the apparatus for processing semiconductor wafers includes three processing apparatuses arranged such that three respective processing tools are guided radially over the wafer at an angle of 120 degrees with respect to one another.

8. The apparatus as claimed in claim 1, wherein the at least one processing apparatus is movable such that the processing tool can be guided from an edge of the wafer to a center of the wafer.

9. The apparatus as claimed in claim 6, wherein the processing apparatuses are arranged such that the processing tools can be guided over the wafer over partial radii.

10. A method for processing semiconductor wafers, comprising:

rotating a wafer to find at least one feature of the wafer;

determining a wafer position based on the at least one feature found;

rotating the wafer and continuously detecting further features distributed on the wafer;

continuously evaluating features detected during rotary movement of the wafer and calculating the wafer position therefrom;

calculating, in a manner dependent on a current wafer position and a position of a predetermined point on the wafer, how the wafer has to be rotated and how the processing apparatus has to be moved to bring the predetermined point on the wafer under at least one processing tool;

rotating the wafer and moving the at least one processing apparatus in a radial direction above the wafer to position a processing tool of the at least one processing apparatus above the predetermined point on the wafer; and processing the wafer by the processing tool at the predetermined point.

11. The method as claimed in claim 10, wherein the at least one feature includes metalized regions on the wafer which differ from the rest of the wafer in reflectivity to light or in form.

12. The method as claimed in claim 10, wherein the rotation of the wafer is effected at a constant angular velocity and the processing of the wafer is effected as the wafer is rotating.

13. The method as claimed in claim 10, wherein the movement of the processing apparatus is coordinated with the rotation of the wafer such that, in order to process the wafer at all predetermined points, the processing apparatus needs to be guided only once over a radius of the wafer.

14. The method as claimed in claim 10, wherein the processing is effected by a plurality of the processing tools of a plurality of the processing apparatuses.

15. The method as claimed in claim 10, wherein the processing includes laser burning of a surface of the wafer.

* * * * *